United States Patent [19]

Gampell et al.

[11] Patent Number: 5,287,107

[45] Date of Patent: Feb. 15, 1994

[54] OPTICAL ISOLATION AMPLIFIER WITH SIGMA-DELTA MODULATION

[75] Inventors: David J. Gampell, Sunnyvale; Michael D. McJimsey, Mountain View; Ralph E. Lovelace, Los Gatos; Randall Canha, Newark, all of Calif.

[73] Assignee: Hewlett-Packard Company, Palo Alto, Calif.

[21] Appl. No.: 893,786

[22] Filed: Jun. 5, 1992

[51] Int. Cl.$^5$ ............................................. H03M 3/02
[52] U.S. Cl. ................................... 341/137; 341/143; 341/110
[58] Field of Search ......................... 341/110, 137, 143

[56] References Cited

U.S. PATENT DOCUMENTS

| | | | |
|---|---|---|---|
| 4,035,783 | 7/1977 | Mathewson | 341/110 |
| 4,101,881 | 7/1978 | De Freitas | 341/110 |
| 4,109,309 | 8/1978 | Johnstone et al. | 341/110 |
| 4,439,756 | 3/1984 | Shenoi et al. | 340/347 |
| 4,617,551 | 10/1986 | Ophoff | 341/137 |
| 4,843,339 | 6/1989 | Burt et al. | 330/10 |
| 4,843,391 | 6/1989 | Lernout | 341/143 |
| 4,939,516 | 7/1990 | Early | 341/143 |
| 4,967,038 | 10/1990 | Gevins et al. | 128/644 |
| 5,006,850 | 4/1991 | Murphy | 341/110 |
| 5,061,859 | 10/1991 | Lovelace et al. | 250/551 |

OTHER PUBLICATIONS

Boser, "Design and Implementation of Oversampled A/D Converters", PhD. Thesis, Stanford University, 1988, Chapters 2, 3 & 5.

Candy, et al., "The Structure of Quantization Noise from Sigma Delta Modulation", Sep. 1981, IEEE Transactions on Communications, vol Com-29, No. 9, 8 pp. 1316 to 1323.

Candy, "A Use of Double Integration in Sigma Delta Modulation" IEEE Transactions on Communications, vol. Cm-33, No. 3, Mar. 1985, pp. 249-258.

Brandt, et al., "Second-Order Sigma-Delta Modulation for Digital-Audio Signal Acquisition", 37 pages, Center for Integrated Systems, Stanford University, Sep. 10, 1990.

Lee, et al., "Low-Distortion Switched-Capacitor Filter Design Techniques", IEEE Journal of Solid-State Circuits, vol. SC-20, No. 6, Dec. 1985-pp. 1103-1112.

Hsieh, et al., "A Low-Noise Chopper-Stabilized Differential Switched-Capacitor Filtering Technique", IEEE Journal of Solid-State Circuits, vol. SC-16, No. 6, Dec. 1985, pp. 708-715.

Castello, et al., "A High-Performance Micropower Switched-Capacitor Filter", IEEE Journal of Solid-State Circuits, vol. SC-20, No. 6, Dec. 1985, pp. 1122-1132.

Boser, et al. "Simulating and Testing Oversampled Analog-to-Digital Converters", Jun. 1988, IEEE Transactions on Computer-Aided Design, vol. 7., pp. 668-673.

Boser, et al., "The Design of Sigma-Delta Modulation Analog-to-Digital Converters", Dec. 1988, IEEE Journal of Solid State Circuits, vol. 23, 1298-1308.

Boser, et al., "Quantization Error Spectrum of Sigma-Delta Modulators" Center for Integrated Systems, Stanford University, ISCAS '88, pp. 2331-2334.

Primary Examiner—Marc S. Hoff

[57] ABSTRACT

The present invention provides an optical isolation amplifier which generates a low-noise analog output signal linearly related to an analog input signal and which conveniently fits within a conventional 8-pin dual in-line package. The optical isolation amplifier package includes an input chip having a sigma-delta analog-to-digital (A/D) converter for converting an analog input signal to a digital signal. The sigma-delta converter is used to modulate an off-chip LED which optically transmits the signal to a photodetector on a separate output chip having an accurate optical recovery section for reproducing the transmitted signal. Also contained on the output chip is a digital-to-analog (D/A) converter for converting the digital signal to an analog output signal linearly related to the analog input signal.

23 Claims, 8 Drawing Sheets

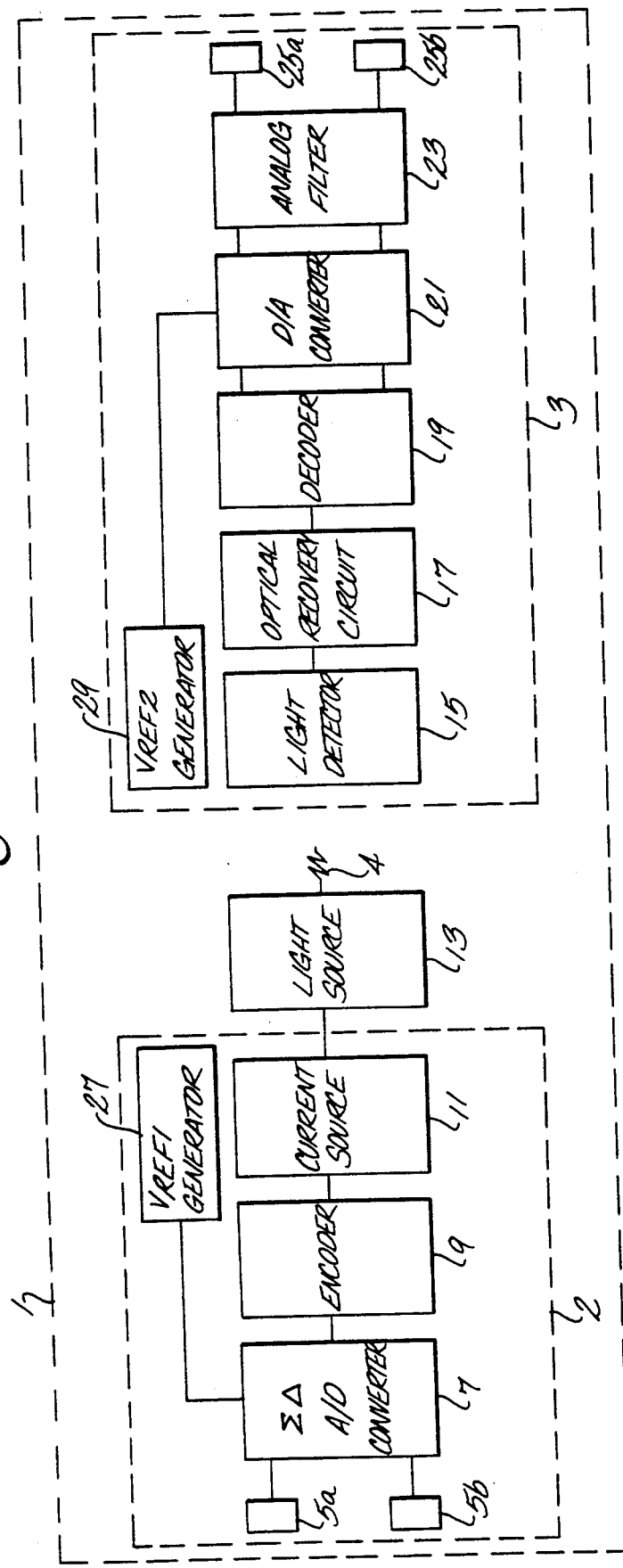

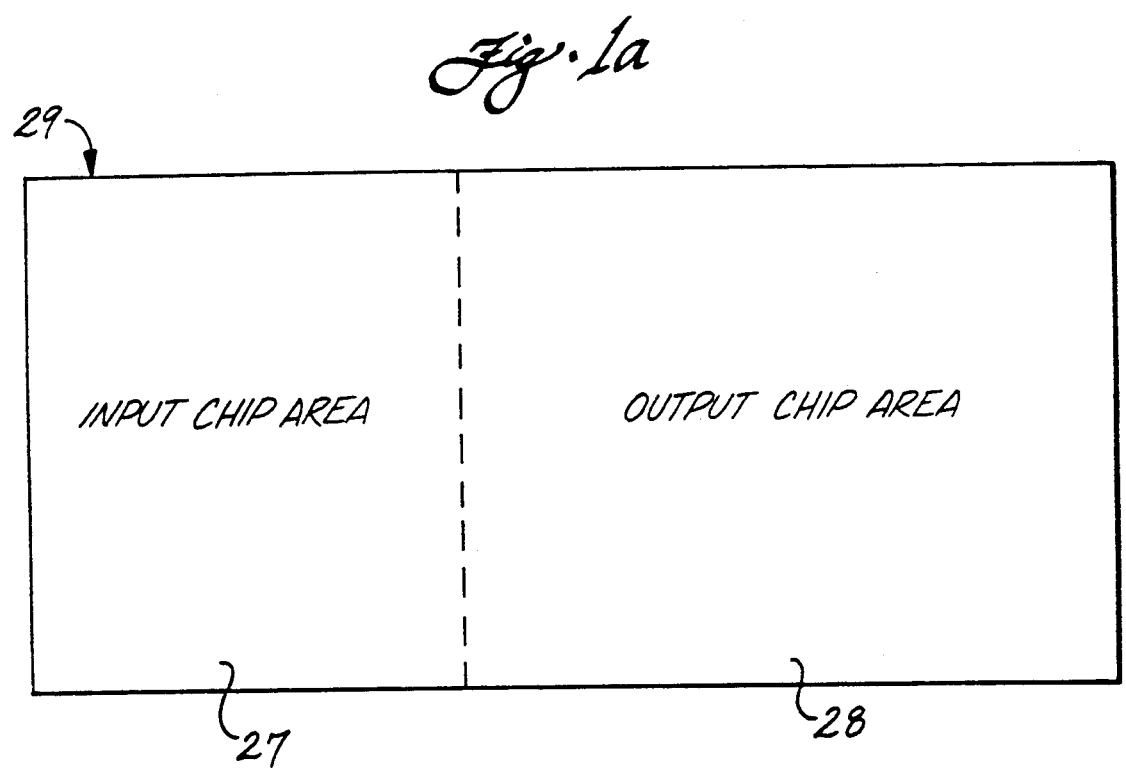

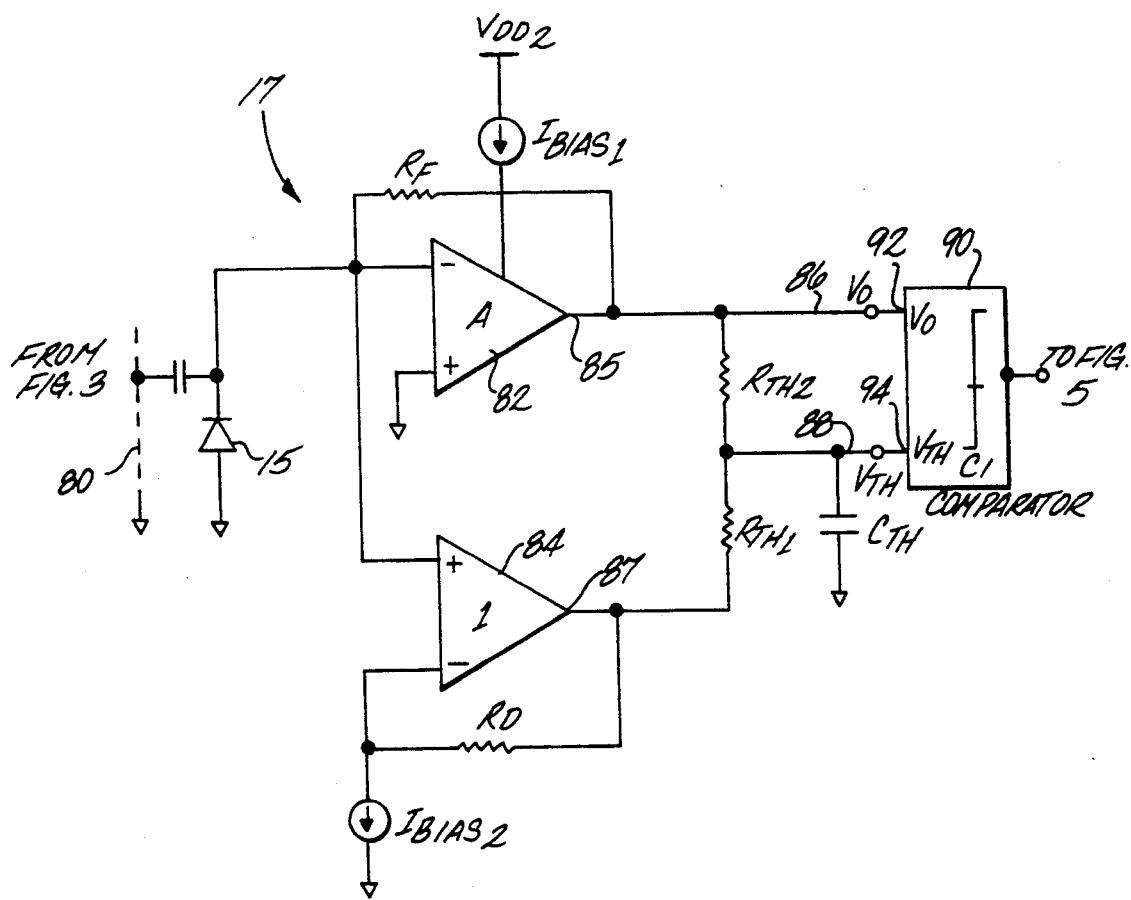

OPTICAL ISOLATION AMPLIFIER WITH SIGMA-DELTA MODULATION

FIELD OF THE INVENTION

This invention relates to sensors and, more particularly, to an isolation amplifier in a dual in-line package containing a sigma-delta converter and an optocoupler. By using the sigma-delta converter in combination with an optocoupler, the amplifier is capable of accurate signal reproduction, well-specified gain, and optical isolation without large power consumption.

BACKGROUND OF THE INVENTION

Sensors are commonly used to measure current or voltage at a particular point in a system and to provide output signals indicative of the sensed current or voltage. In one typical application, a current sensor is used as part of a feedback control circuit for accurately controlling motors in precision equipment, such as automated assembly robots or numerical control machines. The current sensor detects the current flowing through the windings of the motor and delivers a proportional signal to the control circuit. The torque output of the motor is directly related to the current flowing through its windings. Thus, based on the signal from the sensor, the input to the motor can be altered or maintained by the control circuit to precisely control the torque of the motor.

In such applications, the control circuit requires extremely accurate sensing to precisely vary the input to the motor. The output signal from the sensor should ideally be linearly related to the sensed signal and have a well-specified gain to drive downstream circuitry in the feedback loop. Due to large voltages that are present on the motor windings, the sensor output should also ideally be completely isolated from the input to protect from voltage transients or surge currents which could detrimentally affect the control system. Moreover, the sensor should require limited power consumption, be small in volume, and have minimal requirements for cooling. Each of these features must be consistent over varying temperature. Since space is often a constraint, the sensor should also occupy as little space and volume as possible.

In light of these constraints, various sensors have been developed for accurately sensing motor current. Each has advantages and disadvantages. One widely-used type of sensor for precision motors is the Hall effect sensor. This device utilizes the Hall effect to generate a voltage linearly related to the changing current in the motor. The device is comprised of a semiconductor wafer having a DC power source connected to opposite ends of the wafer. The wafer produces voltage proportional to the intensity of the applied magnetic field, which itself is proportional to the motor current. Although this type of sensor provides accurate readings without large power consumption on the input side, power dissipation on the output side can be very large. Moreover, the output of the sensor varies drastically with changing temperature due to the inherent properties of the semiconductor material. Furthermore, due to the relatively large size of the magnetic core, the Hall effect sensor cannot be easily implemented in a small volume.

To lessen the amount of volume required for sensing, certain isolation amplifiers have been developed which do not rely on the Hall effect for sensing and thus do not require a magnetic core. These amplifiers sense a voltage developed across a current-sensing resistor at the input section of the amplifier and transmit the signal non-galvanically to a receiver section of the amplifier, thereby minimizing the interaction of the circuit that follows the amplifier with the circuit that precedes it. These circuits have the advantage of accurate signal sensing capability at constant temperature. However, some of these amplifiers deliver an output and have a gain which varies due to temperature and process variations. Moreover, these circuits, being largely electrical, may require a supply of power which impinges on system requirements, especially if bipolar integrated circuitry is used. Larger power supplies can be constructed to produce sufficient power, but such supplies would add cost and volume to the system. As an alternate, CMOS configurations may be used which require less power, but these circuits produce undesirable substrate currents if the input signal swings below ground. DC biasing or rectification techniques may be used to boost the signal above ground, but such techniques may add errors to the amplifier output which detrimentally affect signal-sensing accuracy.

In addition to preventing the disadvantages discussed, an ideal amplifier should also provide an isolation barrier sufficient to prevent ripple in the output of the amplifier caused by voltage transients and surge currents. In more extreme cases, if the isolation barrier is insufficient, such transients or surges may damage the output circuit of the amplifier or the circuits that follow.

Several solutions have been proposed to establish a sufficient isolation barrier within an amplifier which does not rely on magnetic effects, but each has caused disadvantages in overall sensor performance. In one proposed solution, disclosed in U.S. Pat. No. 4,843,339 issued to Burt et al , capacitors are used to realize the isolation section of the amplifier. Such capacitor isolation, however, suffers from the inability of a capacitor to block rapidly changing voltage inputs (high dV/dt), such as high-frequency voltage transients. This inability limits amplifiers with capacitor isolation from being used for noisy applications.

Optocouplers, also known as optoisolators or optical isolators, have also been proposed for isolation. Optocouplers convert an electrical input signal to an optical signal, transmit the optical signal, and restore the transmitted signal to an electrical output signal similar to the electrical input signal. Although optical isolation is strong and provides superior transient rejection as compared to capacitor isolation, the LED used to realize the transmitter section of the optocoupler causes disadvantages. Due to nonlinearities of the LED, errors are introduced into the analog signals at the detector end of the coupler. If digital transmission is used, errors due to nonlinearities can be reduced, but the LED will have to be turned on and off, resulting in large power supply fluctuation which can cause undesirable system effects.

It is, therefore, desirable to provide an isolation amplifier for accurately sensing voltage or current, which provides a linear output, has complete isolation, and a well-specified gain, each of which does not vary with changing temperature or fabrication processing.

It is also desirable to construct the amplifier out of CMOS devices without having to rectify or bias the input signal.

It is further desirable to provide such an amplifier with strong optical isolation which does not require a large amount of power or power supply fluctuation.

It is still further desirable that the isolation amplifier be relatively inexpensive and that the complete isolation amplifier fit into a conventional 8-pin dual in-line package (DIP) which occupies a minimum amount of space and volume.

SUMMARY OF THE INVENTION

The present invention provides an optical isolation amplifier package which possesses all or some of these desirable characteristics and which conveniently fits within a conventional 8-pin DIP. The optical isolation amplifier package includes an input chip having a sigma-delta analog-to-digital (A/D) converter for converting an analog input signal to a digital signal. The sigma-delta converter is used to modulate an off-chip LED which optically transmits the signal to a photodetector on a separate output chip having an accurate optical recovery section for reproducing the transmitted signal. Also contained on the output chip is a digital signal-to-analog (D/A) converter for converting the digital signal back to an analog output signal linearly related to the analog input signal.

BRIEF DESCRIPTION OF THE DRAWINGS

These and other features and advantages of the present invention will be more fully appreciated and better understood by reference to the following detailed description of a preferred embodiment when considered in connection with the accompanying drawings wherein:

FIG. 1 is a block diagram of the components forming the optical isolation amplifier housed within a conventional dual in-line package;

FIG. 1a is a schematic diagram of adjacent die on a semiconductor wafer used in fabrication of the amplifier;

FIG. 4 is a block diagram of the light detector and optical recovery section on the output chip of the amplifier;

DETAILED DESCRIPTION

Figure 2:
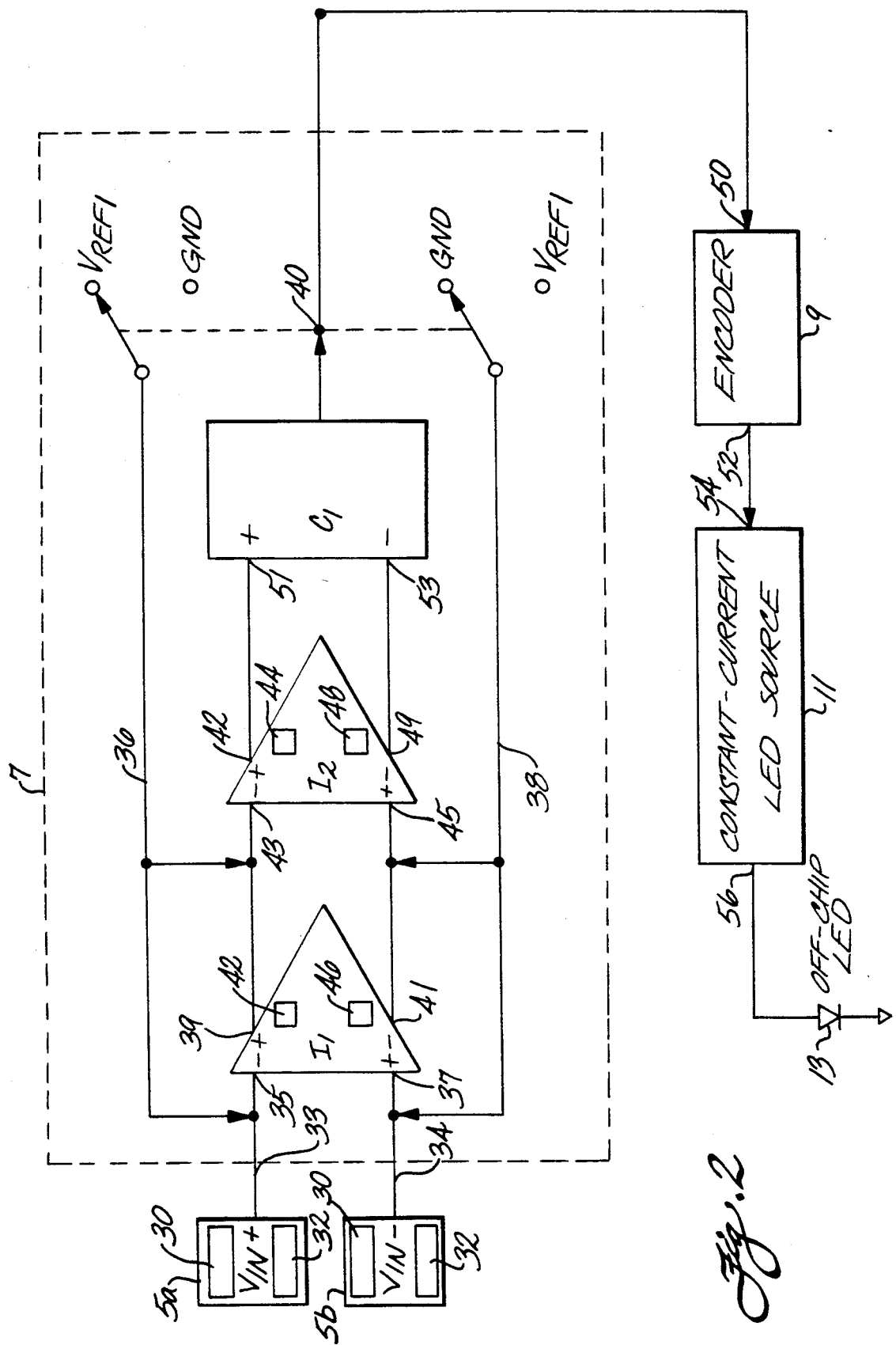
FIG. 2 is a block diagram of the sigma-delta converter, encoder, current source, and off-chip LED of the amplifier.

Referring to FIG. 1, the optical isolation amplifier package 1 according to the present invention includes a first CMOS integrated circuit (IC) chip (input chip) 2 and a second CMOS IC chip (output chip) 3 coupled only by an optical transmission path 4. The input chip is the transmitting end of the amplifier and includes input pads 5a, 5b to an analog-to-digital (A/D) converter 7 connected in series with an encoder 9, a current source 11, and an off-chip light-emitting diode (LED) 13. The output chip is the receiving end of the system and includes a photodiode 15 coupled to an optical recovery section 17, a decoder 19, a digital-to-analog (D/A) converter 21, and an analog filter 23. The output of the isolation amplifier is delivered through output pads 25a, 25b. In an exemplary embodiment, the input chip measures approximately 1.1 mm on a side, and the output chip measures approximately 1.5 mm × 1.1 mm. The entire arrangement is preferably housed in a conventional 8-pin dual in-line package.

In operation, the optical isolation amplifier takes an analog electrical input voltage at the input chip and transmits the electrical input optically to the output chip. The optical signal is then converted on the output chip back into an amplified electrical signal substantially the same as the analog input signal. The amplifier also provides isolation between its transmitting and receiving ends.

The input and output chips 2, 3 are preferably fabricated from adjacent die 27, 28 on the same semiconductor wafer 29. With this fabrication technique, the components on each chip will presumably have similar process variations and will react similarly to temperature variations. Thus, the analog badgap reference voltages ($V_{REF1}$, $V_{REF2}$) for each chip produced by input chip and output chip reference voltage generators 27, 29, respectively, will track one another. Because $V_{REF1}$ is used in the A/D converter 7 on the input chip, and because $V_{REF2}$ is used in the D/A converter 21 on the output chip, the relative performance of these corresponding components will be consistent over temperature and process. This tracking substantially increases the accuracy of the overall system.

Referring to FIG. 2, a differential analog voltage $V_{IN+}-V_{IN-}$ is applied to input pads $V_{IN+}$ 5a and $V_{IN-}$ 5b. Preferably, the $V_{IN-}$ pad is tied to ground, and the $V_{IN+}$ pad swings positive and negative with respect to $V_{IN-}$. The amount of swing is typically no more than ±200 mV. Each input pad preferably contains a p-channel punch-through device 30 to protect internal circuitry against electrostatic discharge transients. The p-channel device is preferred over a conventional n-channel device because the p-n junction of the p-channel device is reverse-biased when the voltage on the input pad is brought below ground. Conversely, the p-n junction of the n-channel device is forward-biased when the input pad is brought below ground. Because of reverse-biasing, the p-channel device greatly reduces substrate current and increases the accuracy of sampling into the A/D converter.

Each input pad also preferably contains a clamping circuit 32 for clamping the input voltage at approximately −0.5 V when the pad swings below approximately −0.5 V. This clamping operation prevents substrate current from flowing through the CMOS circuitry contained in the amplifier and allows for signal input below ground without DC biasing or rectification circuits which require added power and introduce error into the amplifier.

The input pads are coupled to the input nodes 33, 34 of a sigma-delta (A/D) converter 7. The sigma-delta converter translates the differential analog input voltage into a digital pulse stream having a time-average value proportional to the analog input voltage. Within the converter, the converter input nodes are coupled to the differential inputs 35, 37 of a first integrator $I_1$. The outputs 39, 41 of $I_1$ are connected to the differential inputs 43, 45 of a second integrator $I_2$. The differential outputs 47, 49 of $I_2$ are separately connected to the inputs 51, 53 of a comparator $C_1$. Feedback control within the converter is established through negative feedback loops 36, 38 coupled between the output node 40 of the comparator and the differential inputs of both $I_1$ and $I_2$. The output of the comparator switches either a precision analog voltage $V_{REF1}$ or ground back to the integrators $I_1$, $I_2$. The switching of the comparator also produces the digital pulse stream output of the converter at node 40. For a more detailed description of the layout and operation of exemplary differential sigma-delta converters, refer to an article entitled "The Design of Sigma-Delta Modulation Analog-to-Digital Converters" by B. E. Boser and B. A. Wooley appearing in the *IEEE Journal of Solid State Circuits*, Vol. 23, No. 6, Dec. 1988.

In a preferred embodiment, the integrators $I_1$ and $I_2$ each contain chopper stabilized operational amplifiers 42, 44 and precisely matched switched capacitor circuitry 46, 48. For a detailed description of an exemplary chopper stabilized operational amplifier used within an integrator, refer to a paper entitled "A Low-Noise Chopper-Stabilized Differential Switched-Capacitor Filtering Technique" by K. C. Hsieh, et al., appearing in the *IEEE Journal of Solid-State Circuits*, Vol. SC-16, No. Dec. 6, 1981. The chopper stabilized operational amplifiers 42, 44 are desirable because they push DC offset producing noise into higher frequencies out of the baseband of the analog input voltage. A low-pass filter (not shown) can then be used to filter out the noise without disturbing low frequency and DC signals in the bandwidths of interest required for accurate sensing. The switched capacitor implementation is also desirable because it reduces sensitivity to integrated circuit process drift as compared to alternative A/D converter configurations. With precise matching of the switches, noise due to signal-dependent charge injection can also be minimized, further increasing the overall accuracy of the sensor.

The use of a sigma-delta converter within the isolation amplifier provides several desirable features. It will be appreciated that the sigma-delta converter uses a high oversampling rate which provides accurate A/D conversion and a relatively large input bandwidth of 50 kHz to 70 kHz without the use of expensive and bulky anti-aliasing filters. The fully differential configuration of the converter also provides a high common mode rejection which substantially reduces noise to first order, resulting in increased accuracy of the overall sensor. Moreover, such converters occupy a relatively small amount of space and are relatively easy to fabricate on a CMOS chip.

The digital pulse stream output from the sigma-delta converter encodes the analog input signal in a pulse density modulation format. In pulse density modulation, the amplitude information of the analog input signal is contained in the density of output pulses generated during a given interval of time. The lowest and highest amplitude of the analog signal are each represented by no pulses within the interval. The lowest amplitude of the analog input voltage is indicated by a continuous low (zero) output over the interval. Conversely, the highest amplitude of the analog input voltage is indicated by a high (one) output over the interval. As the amplitude moves away from the rails ($V_{REF1}$ or $-V_{REF1}$), an increasing density of pulses appear at the output within the interval, indicative of an amplitude closer to the midpoint of the rails.

Although the digital pulse stream output is a very accurate digital replica of the analog input voltage, the time average of the digital pulse stream may become distorted when optically transmitted due to the inherent nonlinearity of the light-emitting diode 13. This pulse width distortion results in an error component being formed at the output chip 3 (receiver end) of the amplifier which could be unacceptable for precision applications. To prevent this distortion, the digital pulse stream from the sigma-delta converter is edge-encoded by the encoder 9 coupled to the output 40 of the converter. For every edge in the digital pulse stream which enters the encoder through input 50, the encoder sends a pulse from the encoder output 52 to the input 54 of the constant current source 11. The current source output 56 accordingly supplies the off-chip LED 13 with a supply current sufficient for the LED to produce an optical signal. By edge-encoding the signal input to the LED, no pulse width distortion error will occur to the signal from the nonlinearity of the LED.

Figure 3:
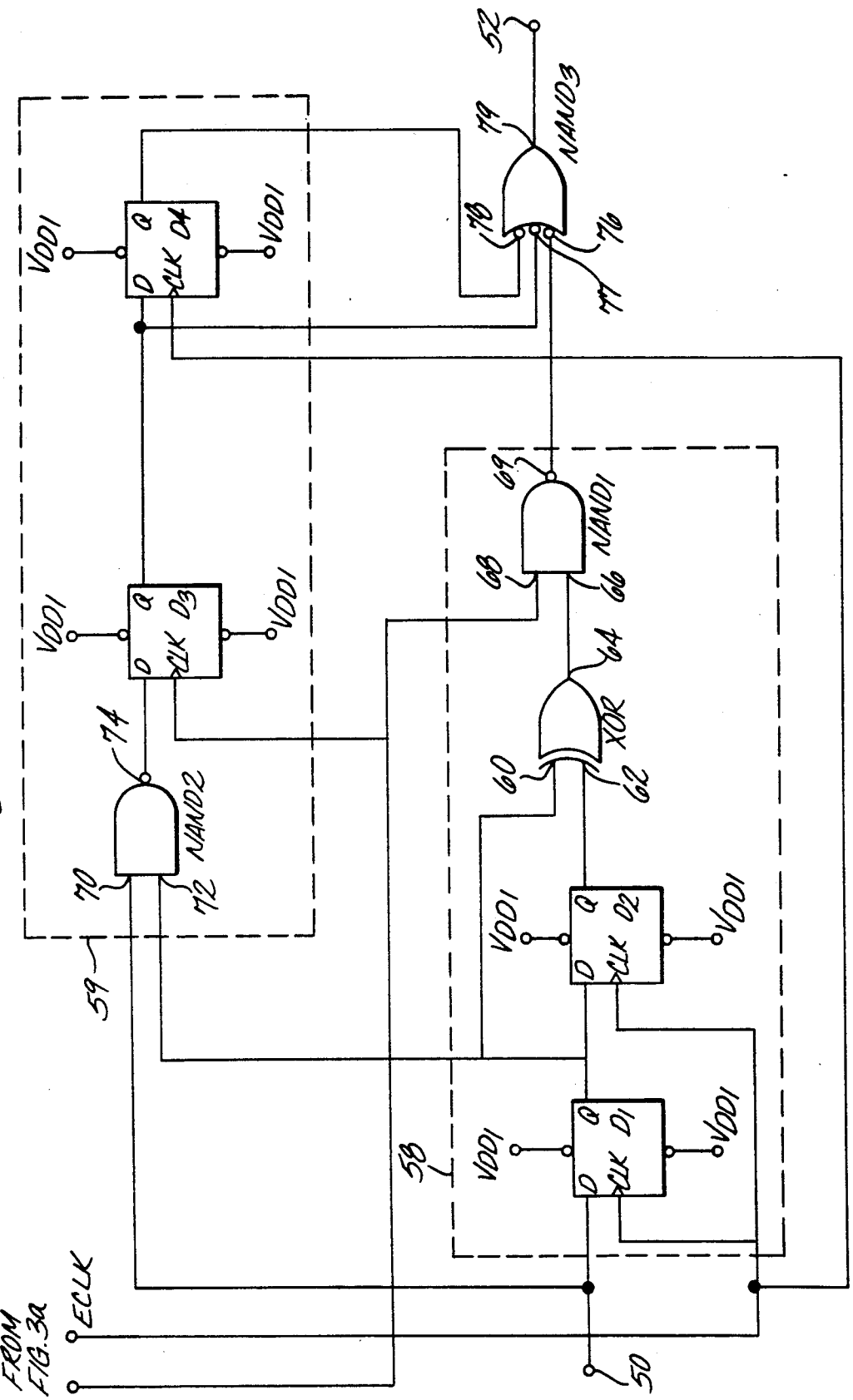
FIG. 3 is a semi-schematic diagram of the encoder.
Figure 3A:
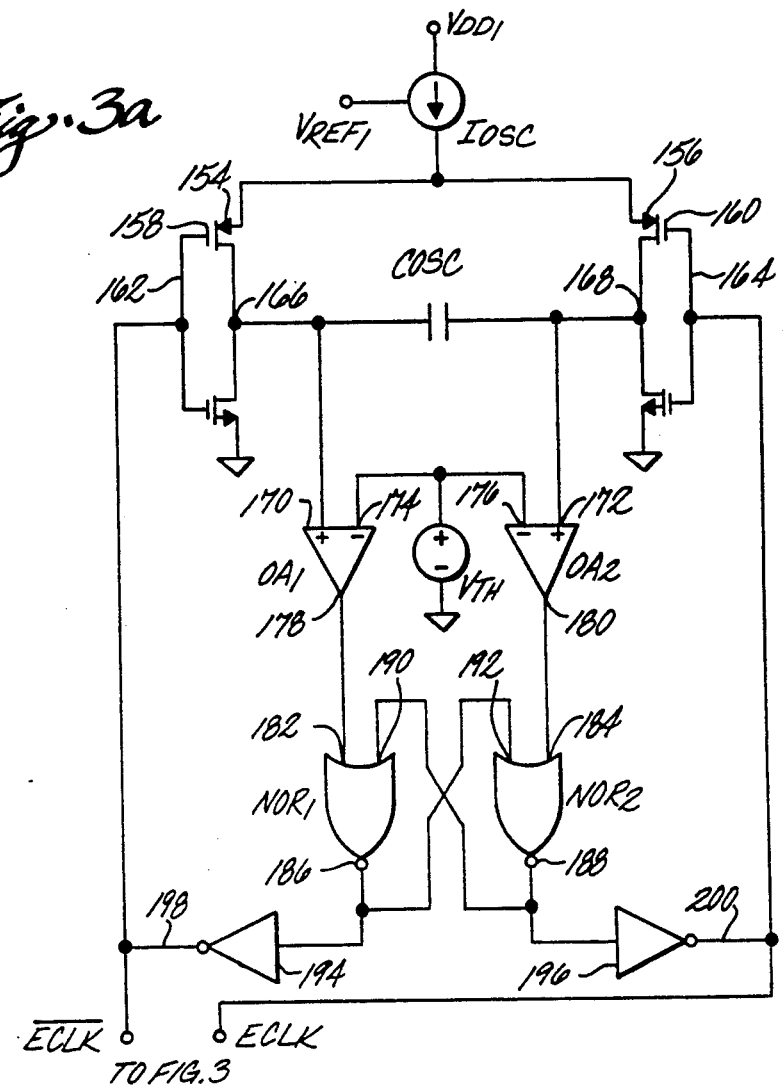
FIG. 3a is a semi-schematic diagram of the oscillator circuit for the encoder of FIG. 3.

An exemplary edge-encoder circuit 9 is shown in FIG. 3. The edge-encoder comprises a synchronous edge detector 58 and a high-state pulse stretcher 59. The digital pulse stream enters the encoder through input node 50, which is coupled to a first D flip-flop D1 within the edge-encoder. The Q output of D1 is coupled to the D input of a second D flip-flop D2, and to a first input 60 of an exclusive OR gate XOR. The Q output of D2 is coupled to a second input 62 of XOR. D1 and D2 are each clocked by a noninverted square-wave clock signal ECLK from a voltage controlled oscillator (VCO) (FIG. 3a). The output 64 of XOR is coupled to a first input 66 of a NAND gate NAND1. The second input 68 of NAND1 receives an inverted clock signal $\overline{ECLK}$ from VCO (FIG. 3a). The output 69 of NAND1 is coupled to the first input 76 of a three-input NAND gate NAND3. The output 80 of NAND3 is coupled to the input 54 of the constant current source 11 (FIG. 2).

The encoder circuit works on the principle of edge-encoding. It generates an output pulse for every rising and falling edge of the input data. Those pulses are sent to the toggle flip-flop (FF) circuit 110 in the decoder 19 (FIG. 5), discussed in more detail below, which changes state on the rising edge of each pulse. Every time the input data changes state, the encoder generates an output pulse, which is transmitted to the output chip and causes the toggle FF circuit to change state. Because the toggle FF circuit is sensitive only to the timing of the rising edges of the pulses, any pulse-width distortion of the transmitted pulses is ignored by the decoder circuit and does not affect the transmitted data.

If the digital pulse stream into the encoder contains more than one "high" signal in a row, the high-state pulse stretcher 59 generates stretched pulses to the constant current source which delivers a current to the LED for a time corresponding to the stretched pulse. This stretched pulse allows the decoder on the output chip of the optical isolator to "lock on" to the digital signal and assume correct signal phase.

The high-state pulse stretcher 59 comprises a NAND gate NAND2 and a pair of matched D flip-flops D3, D4. The digital pulse stream from the sigma-delta modulator at input node 50 is applied to a first input 70 of NAND2. The second input 72 to NAND2 is coupled to the Q output of D1 in the edge-detector circuit 58. The output 74 of NAND2 is applied to the D input of D3. The CLK input to D3 receives the inverted clock signal $\overline{ECLK}$ from VCO (FIG. 3a). The Q output of D3 is coupled to the D input of a D flip-flop D4 and to the second input 77 of NAND3. The CLK input to D4 receives the noninverted clock signal ECLK from VCO (FIG. 3a). The Q output of D4 is coupled to the third input 78 of NAND3. The output 79 NAND3 is coupled to the output node 52 of the encoder circuit and to the input 54 of the constant current source 11 (FIG. 2).

The longer pulses are detected by a dual one-shot (two-shot) circuit in the decoder 19 (FIG. 5) and are used to set the toggle FF circuit 110 (FIG. 5) to the correct state. With this type of encoding, if the sigma-delta output is in the high state for more than one clock period, the decoder will detect this and set the toggle FF circuit to the high state. In addition, because only short pulses are sent for edges that correspond to low levels of the sigma-delta output signal, if the sigma-delta output is in the low state for more than one clock period, the decoder will also detect this and set the toggle FF circuit to the low state.

Referring again to FIG. 2, the constant current source 11 further minimizes noise by reducing the change in power-supply current caused by the switching of the LED. When the current is not flowing to the LED, it is diverted to ground through a pass transistor (not shown), instead of being switched off. This prevents power supply fluctuation as a constraint on the overall system and minimizes supply noise as a detrimental effect to the accuracy of the isolation amplifier output.

Referring to FIG. 4, the transmitter LED is optically coupled over a gridded optical shield 80 to the receiver photodiode 15. The anode of the photodiode is connected to ground. The cathode of the photodiode provides photodiode current to the optical data recovery section 17 of the receiver end (output chip) of the amplifier.

The optical recovery section 17 reproduces the encoded digital data from the input chip. The photodiode current is applied to a transimpedance amplifier 82 and unity gain op-amp 84 to produce an output voltage $V_o$ and a tracking reference voltage at the respective outputs 85, 87 of the amplifiers. The voltages are applied to a delayed decaying voltage divider comprising resistors RTH1 and RTH2 and a capacitor CTH to produce a threshold voltage $V_{TH}$. In an exemplary embodiment, $V_o$ will be 0 volts AC when no current flows from the photodiode, and $V_o$ will rise to approximately 400 mV AC when the photodiode is activated by light from the LED. The threshold voltage $V_{TH}$ follows the movement of $V_o$. The output terminals 86, of the optical recovery section are connected to the inputs 92, 94 ($V_o$, $V_{TH}$) of the voltage comparator 90. The exemplary comparator operates such that its output generates an ON-signal when the voltage $V_o$ at input 92 is more positive than the voltage $V_{TH}$ at input 94. Thus, the comparator output switches whenever the relative voltage at its input reverses polarity.

The optical recovery section allows for fast switching of the comparator 90 to reproduce the encoded digital signals. This fast switching increases the overall speed of the isolation amplifier and allows continuous sensing of the differential input voltage to the amplifier. For a more detailed description of the optical recovery section of the optical isolation amplifier, refer to U.S. Pat. No. 5,061,859, the contents of which are hereby incorporated by reference.

A significant difference between the optical recovery section of the present invention and that disclosed in the patent is that the gridded polysilicon photodiode shield 60 is connected to ground in the present invention, instead of being driven by a unity gain buffer. This shield picks up stray electrical signals and delivers them to ground, thus preventing the stray signals from creating noise. The connection of the shield to ground, instead of to a unity gain buffer, provides superior isolation mode rejection in the present invention. Thus, the receiver side of the amplifier maintains increased accuracy.

Figure 5A:
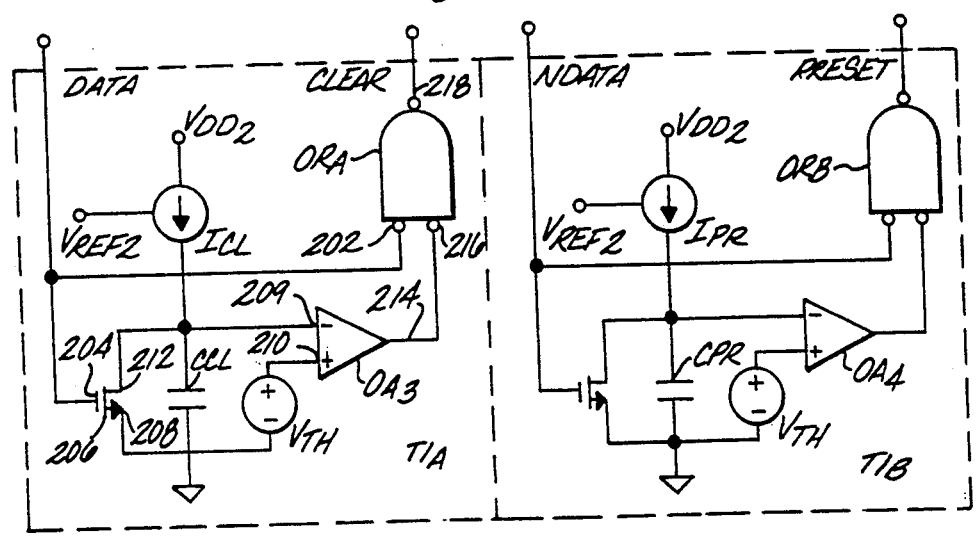
FIG. 5a is a semi-schematic diagram of the timing circuit used within a component of the decoder of FIG. 5.
Figure 5:
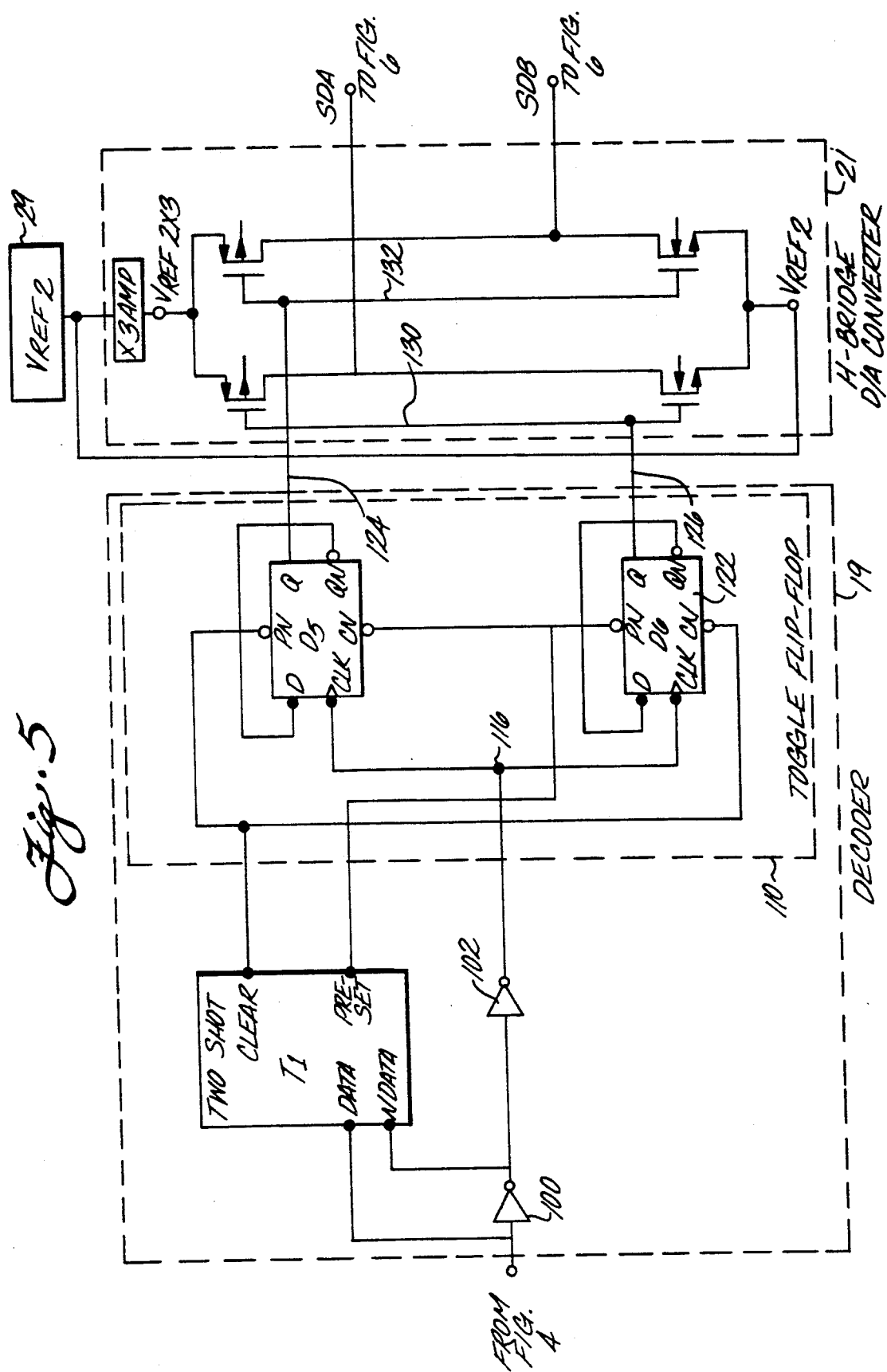
FIG. 5 is a semi-schematic diagram of the decoder and digital-to-analog converter on the output chip of the amplifier.

Referring to FIG. 5, the comparator 90 (FIG. 4) is coupled to a decoder circuit 19 which reads edges of the signals encoded by the encoder 9 on the input chip. By looking at only the positive edges of the pulses, pulse width distortion due to the optical transmission of the signal is eliminated. The output signal from the comparator 90 is applied to the DATA input of a dual one-shot flip-flop (two-shot) T1 and an inverter 100 within the decoder 19. The output of the inverter 100 is applied to the NDATA input of T1 and to the input 104 of a time delay inverter circuit 102. The CLEAR output of the two-shot is connected to the PN input of a first D flip-flop D5 and the CN input of a second D flip flop D6 which is identical to D5. D5 and D6 form a toggle flip-flop circuit 110. The PRESET output of T1 is connected to the CN input of D5 and the PN input of D6. The output 116 of the time delay circuit 102 is connected to the clock inputs of both D5 and D6. The QN output of D5 is coupled to the D input of D5 and the QN output of D6 is connected to the D input of D6. The Q outputs of D5 and D6 are applied at output nodes 124 and 126 as differential input to a conventional H-bridge D/A converter 21. The preferable use of Q outputs from two matched D flip-flops provides superior single-ended to differential signal conversion as compared to the use of two outputs Q, QN from the same flip-flop.

The operation of the decoder is as follows. The comparator C1 squares up the difference pulses between its inputs 92, 94 to true digital levels, whereupon they pass through the dual one-shot T1 consisting of a low-state detector and a high-state detector. T1 acts to "refresh" the correct polarity of the output data in case of an inadvertent start-up in the incorrect (180° out-of-phase) state. If the incoming data has a stretched high pulse in it, as described above, the high-state detector inside T1 fires, and node PRESET goes low, forcing one D flip-flop output low and the other high. This action sets the output data polarity correctly. Similarly, if a period of no incoming data pulses is observed, the low-state detector in T1 fires, and node CLEAR goes low, setting the dual flip-flops in the opposite state. If the incoming data is, for example, a 50% duty-cycle square wave (not stretched pulses), the dual one-shot does nothing, and nodes CLEAR and PRESET remain high. The squared-up pulse data then clocks the D flip-flops which are set up to toggle for each pulse. The output nodes 124, 126, therefore, toggle on every rising edge of the incoming data corresponding to each transmitted pulse of the original data from the sigma-delta converter. The original unencoded sigma-delta output data is now recovered.

The precise interaction between the encoder 9 and decoder 19 is further augmented because the two-shot timing circuit (FIG. 5a) is designed to track the clock period of the voltage-controlled oscillator (FIG. 3a) on the input chip. This tracking, as described in detail below, substantially increases the accuracy of the overall optical isolation amplifier.

The conventional voltage-controlled oscillator VCO for the encoder circuit (FIG. 3) is shown in FIG. 3a. The VCO has a symmetrical design and produces a square wave output at nodes 198, 200 with a duty factor of approximately 50%. A current source $I_{OSC}$, referenced to $V_{REF1}$, is connected to the sources 154, 156 of the p-channel channel transistors 158, 160 within a pair of CMOS inverters 162, 164. The outputs 166, 168 of the CMOS inverters are coupled across a capacitor COSC, and are each connected to the noninverting inputs 170, 172 of a pair of matched operational amplifiers OA1, OA2. The noninverting inputs 174, 176 of the operational amplifiers are both connected to a voltage source $V_{TH}$. The output 178 of OA1 is connected to a first input 182 of a first NOR gate NOR1. The output 180 of OA2 is connected to a first input 184 of a second NOR gate NOR2, electrically matched with NOR1. The outputs 186, 188 of NOR1 and NOR2, are cross-coupled to the second inputs 190, 192 of NOR1 and NOR2. The respective outputs 186, 188 of NOR1 and NOR2 are each connected to the inverters 194, 196. The output 198 of the inverter 194 is the clock signal $\overline{ECLK}$ to the encoder (FIG. 3) and the output 200 of inverter 196 is the inverting clock signal ECLK to the encoder (FIG. 3).

It should be noted that three primary factors determine the period of oscillation of VCO: the amplitude of current source $I_{OSC}$, the value of capacitor COSC, and the comparator threshold voltage $V_{TH}$. $I_{OSC}$, as well as $V_{TH}$, is referenced to the internal precision voltage reference $V_{REF1}$ to obtain very stable and predictable frequency characteristics.

Referring to FIG. 5a, the timing circuit for the two-shot shot T1 is shown. Two-shot T1 consists of one-shots T1A and T1B. The DATA input of T1 is coupled to first input 202 of OR gate ORA and to the gate 204 of an n-channel MOSFET 206 in T1A. The source 208 of the NMOS is connected across a voltage source $V_{TH}$ to the noninverting input 210 of operational amplifier OA3. The drain of the NMOS is connected to the inverting input 209 of the operational amplifier OA3. A capacitor CCL is connected between the source 208 and drain 212 of the NMOS. The power source for T1A comes from current source $I_{CL}$ derived from the second chip reference voltage source $V_{REF2}$. The output 214 of the operational amplifier is connected to a second input 216 of the OR gate. The output 218 of the OR gate is connected to the CLEAR output of two-shot T1.

The operation and layout of second one-shot T1B is substantially similar to T1A, except the input to T1B is the NDATA (instead of DATA) input to the two-shot T1, and the output from T1B is the PRESET output from two-shot T1. Also, the capacitor used in T1B is CPR (instead of CCL), and the current source used in T1B is $I_{PR}$ (instead of $I_{CL}$).

The two-shot timer circuit is designed so that its timing period tracks the clock period of the voltage-controlled oscillator on the input chip. Similar to the oscillator, three primary factors determine the timing period of the two-shot circuit: the amplitude of the current sources $I_{CL}$ and $I_{PR}$, the value of the timing capacitors CCL and CPR, and the comparator threshold voltage $V_{TH}$. As in the voltage-controlled oscillator, $I_{CL}$, $I_{PR}$, and $V_{TH}$ are referenced to the on-chip precision voltage reference $V_{REF2}$ to obtain very stable and predictable timing characteristics. Because the primary timing factors of the voltage-controlled oscillator and the two-shot timer are matched, the two circuits will track one another with changes in temperature and process IC and provide accurate decoding of the sigma-delta output data.

The output signals of the flip-flops containing the recovered digital data then pass into a conventional H-bridge D/A converter, also shown in FIG. 5, comprising a pair of coupled CMOS inverters 130, 132. The outputs, SDA and SDB, of the circuit switch between two precision analog voltages $V_{REF2}$ and $V_{REF2}\times3$. In this way, the digital data at nodes 124 and 126 is converted to analog data with the same duty cycle. The analog voltage source ($V_{REF2}$) 29 used in the H-bridge D/A converter is electrically matched to the similar analog source ($V_{REF1}$) 27 on the LED input chip 2 of the optocoupler (FIG. 1). This matching ensures excellent gain stability because the gain depends primarily on to the ratio of the reference voltages ($V_{REF1}$, $V_{REF2}$) of the input and output chips.

Figure 6:
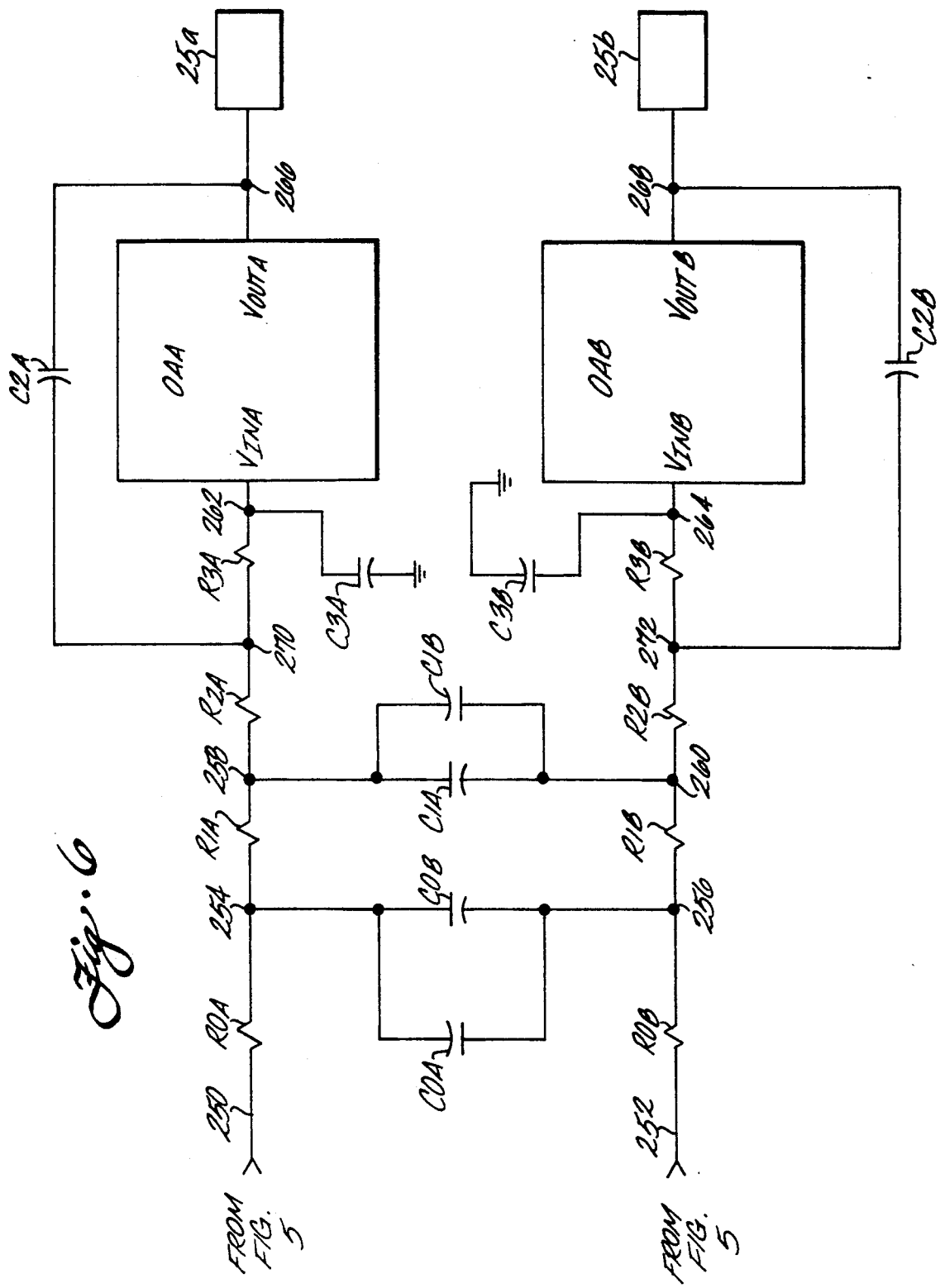
FIG. 6 is a semi-schematic diagram of the analog output filter on the output chip of the amplifier.

Referring to FIG. 6, a four-pole RC-based filter that feeds two chopper-stabilized operational amplifiers OAA, OAB is shown. Both input and output common-mode ranges are within approximately one volt of the power supplies.

The differential analog output signal from the D/A converter 21 is applied to differential input nodes 250, 252 of the filter 23. The node 250 is connected to a series of four resistors R0A, R1A, R2A, and R3A. The node 252 is connected to a series of four resistors R0B, R1B, R2B, and R3B, each preferably having a resistance the same as the corresponding resistors connected to node 250. Two shunted capacitors, C$\phi$A and C$\phi$B, preferably having the same capacitance, are connected between nodes 254 and 256. Two more shunted capacitors C1A and C1B, preferably having the same capacitances as C0A and C0B, are connected between nodes 258 and 260. Node 262 is connected across capacitor C3A to ground and to input $V_{INA}$ of an operational amplifier OAA. Node 264 is connected across capacitor C3B, preferably having the same capacitance as C3A, to ground, and to the input $V_{INB}$ of an operational amplifier OAB. In a preferred embodiment, OAA and OAB are matched and are chopper-stabilized to achieve very low offset levels. The output $V_{OUTA}$ of op amp OAA is connected to node 266, which output is fed back to node 270 at the input side of OAA. Similarly, the output $V_{OUTB}$ of op amp OAB is fed back to node 272 at the input side of OAB. The outputs $V_{OUTA}$ and $V_{OUTB}$ are also connected to output pads 25a and 25b, respectively, of the output chip.

It will be appreciated that no current flows through the series resistors of the analog filter. They are used to drive OAA and OAB. Thus, they contribute no offset to the analog output signal at the output pads 25a, 25b. Also, the fully differential layout of the decoder 19, D/A converter 21, and filter 23 ensure that power supply noise and other common mode effects do not affect the accuracy of the differential output signals at the output pads 25a, 25b.

It will further be appreciated from the foregoing description that the differential output signals at the output pads will be linearly related to the analog input signals which entered the input pads, 5a, 5b on the input chip.

Although a detailed description of a presently preferred embodiment has been set forth, it should be apparent to one skilled in the art that alternate embodiments exist which do not depart from the spirit and scope of the present invention. For example, various types of edge-encoders and decoders may be used. The analog filter, D/A converter, and the reference voltage generators used may be readily tailored to meet specific noise and gain requirements of a particular application. Also, the entire optical isolation amplifier may be housed within DIPs with varying numbers of pins.

What is claimed is:

1. An optical isolation amplifier package comprising:
   an input chip having a chopper-stabilized sigma-delta converter for converting an analog input signal to a digital signal;
   a light source for optically transmitting the digital signal; and
   an output chip having:
   means for detecting the optically transmitted digital signal; and
   means for converting the optically transmitted digital signal into an analog output signal substantially proportional to the analog input signal.

2. The optical isolation amplifier package of claim 1, wherein the input chip further comprises at least one input pad for receiving the analog input signal and a clamping circuit coupled to the pad for clamping the analog input signal and inhibiting substrate current in a CMOS chip.

3. The optical isolation amplifier package of claim 2, wherein each input pad comprises a p-channel punch through device.

4. The optical isolation amplifier package of claim 1, further comprising an edge encoder on the input chip coupled to the sigma-delta converter.

5. The optical isolation amplifier package of claim 4, wherein the means for converting the transmitted digital signal to the analog output signal comprises an edge decoder.

6. The optical isolation amplifier package of claim 5, wherein the edge encoder comprises an oscillator, and the edge decoder comprises a timing circuit which tracks the oscillator.

7. The optical isolation amplifier package of claim 1, wherein the input chip and the output chip are both cut from a single semiconductor wafer.

8. The optical isolation amplifier package of claim 1, wherein the input chip further comprises an input chip reference voltage generator, and the output chip further comprises an output chip reference voltage generator matched with the input chip reference voltage generator.

9. The optical isolation amplifier package of claim 1, wherein the input chip and the output chip are both housed in a single dual in-line package.

10. An optical isolation amplifier comprising:
    input pads for receiving an analog input signal;
    a sigma-delta converter coupled to the input pads for converting the analog input signal to a digital pulse stream;
    an encoder coupled to the sigma-delta converter for converting the digital pulse stream to edge-encoded digital signals; and
    an optical transmitter/receiver coupled to the encoder for transmitting an optical signal indicative of the digital signal over an optical channel and detecting the transmitted optical signal.

11. The optical isolation amplifier of claim 10 further comprising:
    an optical recovery circuit coupled to the optical transmitter/receiver for converting the detected signal to a digital output signal substantially similar to the digital signal; and
    a digital-to-analog converter coupled to the optical recovery circuit for converting the digital output signal to an analog output signal linearly related to the analog input signal.

12. The optical isolation amplifier of claim 10 further comprising a decoder circuit coupled between the optical recovery circuit and the digital-to-analog converter.

13. The optical isolation amplifier of claim 10 further comprising an analog filter coupled to output of the digital-to-analog converter.

14. The optical isolation amplifier of claim 10, wherein each input pad comprises a p-channel punch-through device.

15. The optical isolation amplifier of claim 10, wherein each input pad comprises clamping circuitry for clamping the analog input voltage at a sufficient level below ground for preventing substrate current in a CMOS chip.

16. The optical isolation amplifier of claim 10, wherein the sigma-delta converter comprises chopper-stabilized operational amplifiers.

17. The optical isolation amplifier of claim 10 wherein the optical transmitter/receiver comprises a light-emitting diode and a photodiode.

18. The optical isolation amplifier of claim 10, wherein the optical isolation amplifier is housed within a dual in-line package.

19. A method for sensing signals in a system comprising the steps of:
    providing an optical isolation amplifier having an input chip including a sigma-delta analog-to-digital converter optically coupled to an output chip;
    passing an analog voltage input signal into the isolation amplifier;
    converting the analog voltage signal to a plurality of digital pulses having a time-average value substantially equal to the analog voltage input signal;
    edge-encoding the digital pulses; and
    modulating a light emitting diode with the edge-encoded digital pulses.

20. The method of claim 19 further comprising the step of converting the digital pulses to analog voltage output signals substantially proportional to the analog voltage input signals.

21. The method of claim 19, wherein the step of providing an optical isolation amplifier comprises providing the input chip and the output chip within a single dual in-line package.

22. An optical isolation amplifier package comprising:
    an input chip having a p-channel punch-through device coupled to a sigma-delta converter for receiving an analog signal and converting the analog signal to a digital signal;
    a light source for optically transmitting the digital signal; and
    an output chip optically coupled to the light source for receiving the digital signal.

23. The optical isolation amplifier package of claim 22 further comprising means coupled to the sigma-delta convertor for edge-encoding the digital signal before it is optically transmitted by the light source.

* * * * *